(12) United States Patent
Kanev et al.

(10) Patent No.: US 8,278,951 B2
(45) Date of Patent: Oct. 2, 2012

(54) PROBE STATION FOR TESTING SEMICONDUCTOR SUBSTRATES AND COMPRISING EMI SHIELDING

(75) Inventors: Stojan Kanev, Thiendorf OT Sacka (DE); Hans-Jurgen Fleischer, Priestewitz (DE); Stefan Kreissig, Venusberg (DE); Karsten Stoll, Sohland an der Spree (DE); Axel Schmidt, Thiendorf OT Stöpchen (DE); Andreas Kittlaus, Bad Liebenwerda OT Theisa (DE)

(73) Assignee: Cascade Microtech, Inc., Beaverton, OR (US)

( * ) Notice: Subject to any disclaimer, the term of this patent is extended or adjusted under 35 U.S.C. 154(b) by 752 days.

(21) Appl. No.: 11/940,355

(22) Filed: Nov. 15, 2007

(65) Prior Publication Data

US 2008/0116918 A1 May 22, 2008

(30) Foreign Application Priority Data

Nov. 17, 2006 (DE) .......................... 10 2006 054 672

(51) Int. Cl.
*G01R 31/00* (2006.01)
(52) U.S. Cl. .......... 324/750.19; 324/750.26; 324/750.27
(58) Field of Classification Search ........................ None
See application file for complete search history.

(56) References Cited

U.S. PATENT DOCUMENTS

| | | | | |
|---|---|---|---|---|
| 5,532,609 A | * | 7/1996 | Harwood et al. | ............. 324/754 |
| 5,604,444 A | * | 2/1997 | Harwood et al. | ............. 324/754 |
| 5,638,003 A | * | 6/1997 | Hall | ............................... 324/514 |
| 5,835,997 A | * | 11/1998 | Yassine | ..................... 324/750.14 |
| 7,038,441 B2 | * | 5/2006 | Stoll et al. | ................... 324/158.1 |
| 7,180,317 B2 | * | 2/2007 | Hollman | ......................... 324/760 |
| 7,235,990 B1 | * | 6/2007 | Kreissig et al. | ........... 324/750.27 |
| 2005/0110508 A1 | | 5/2005 | Kishida | |

FOREIGN PATENT DOCUMENTS

| | | |
|---|---|---|
| DE | 103 508 59 | 9/2004 |
| DE | 695 32 429 | 11/2004 |
| DE | 202 21 050 | 1/2005 |

OTHER PUBLICATIONS

English-language abstract of U.S. Patent Application Publication No. 2004/164752 which corresponds to German Patent Publication No. DE 103 508 59, downloaded on Apr. 23, 2012 from http://worldwide.espacenet.com.
English-language abstract of European Patent Publication No. EP 0685745 which corresponds to German Patent No. DE 695 32 429, downloaded on Apr. 23, 2012 from http://worldwide.espacenet.com.
English-language abstract of German Utility Model Publication No. DE 202 21 050, downloaded on Apr. 23, 2012 from http://worldwide.espacenet.com.

* cited by examiner

*Primary Examiner* — Paresh Patel
(74) *Attorney, Agent, or Firm* — DASCENZO Intellectual Property Law, P.C.

(57) ABSTRACT

A probe station for testing semiconductor substrates, i.e., wafers and other electronic semiconductor elements, suitable for carrying out low-current and low-voltage measurement, comprises a shielding with which the electromagnetic influence (EMI) of the measurement of the semiconductor substrate can be minimized, and also comprises devices for the preparation of test signals. In addition, the housing of the probe station can offer a different possibility for the accessibility of individual components or component groups of the probe station.

12 Claims, 3 Drawing Sheets

PROBE STATION FOR TESTING SEMICONDUCTOR SUBSTRATES AND COMPRISING EMI SHIELDING

CROSS REFERENCE TO RELATED APPLICATIONS

This application claims priority from German patent application No. 10 2006 054 672.5, filed on Nov. 17, 2006, the entire disclosure of this application being hereby incorporated herein by reference.

BACKGROUND OF THE INVENTION

The invention relates to a probe station for testing semiconductor substrates, that is, wafers and other electronic semiconductor elements, said probe station being suitable for carrying out low-current and low-voltage measurement. For this purpose the probe station comprises a shielding system with which the electromagnetic influence (EMI) of the measurement of the semiconductor substrates can be minimized.

In conventional probe stations an EMI shielding system comprises a housing in which at least the components for receiving the semiconductor substrates, including their positioning unit, as well as the components for receiving and positioning the probes, are disposed and thus are shielded from external electromagnetic and optical influences. The interfaces to the outside are the cables to the control and evaluation units.

SUMMARY OF THE INVENTION

The described probe station provides an EMI shielding system which is comprehensive and to be adapted to various requirements. Thus, in one development a device for signal preparation, e.g., for signal preprocessing or for signal processing, is included in the EMI shielding by the device in question being integrated into the housing so that this device is in the immediate vicinity of the signal input. With this, very short cables to devices for signal preparation or signal processing and to additional circuit components are possible. Furthermore, cables which act outside of the housing as an antenna and can compromise the measurement can be integrated into the shielding of the housing. Relating to accommodating components and cables in the shielding are, for example, signal preamplifiers, impedance analyzers such as, for example, the 42941A, an impedance probe kit which can be used for impedance measurements and impedance analyses in a wide frequency range up to 110 MHz, or devices for feeding a bias signal, circuit devices for switching the guard, amplification or signal processing devices for the measurement of the 1/f noise, or 1-mm cables which have, for use for high-frequency signals, a definite structure, and so on.

The integration of such, or comparable, devices and their cables into the EMI shielding system is done in such a manner that also within the system a mutual influence of the devices and the semiconductor substrates can be minimized.

The proposed probe station also has the capability of configuring the shielding system for shielding with respect to low-frequency magnetic fields. Such a shielding is achieved by a housing, or housing walls, of thick, ferromagnetic materials.

Despite the complex and variable shielding system, the individual components to be operated during a measurement cycle, such as, for example, the positioning unit of the chuck and in given cases also the probes, are accessible and a monitoring of the semiconductor substrate during the measurement is possible. For this purpose the housing of the probe station is subdivided so that the probe holders with their positioning units comprise their own housing sections which can accommodate additional components or devices which can be enhanced in a modular manner and are accessible by opening these housing sections while the housing section directly enclosing the semiconductor substrate remains closed.

DESCRIPTION OF THE EMBODIMENTS

Figure 1:
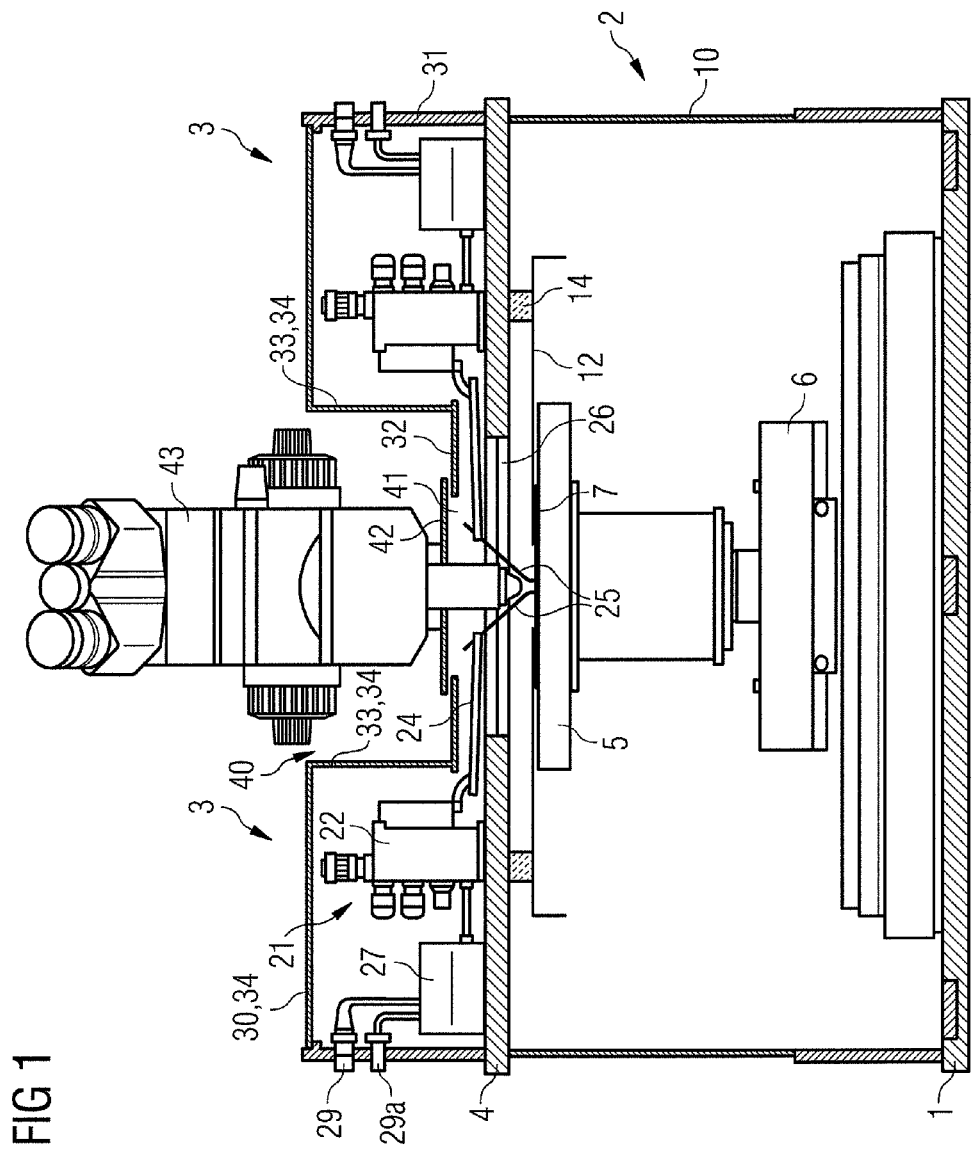
FIG. 1 shows, in a frontal sectioned representation, a probe station with a housing, where the housing is subdivided into two housing sections by a probe holder plate.

A probe station's form of embodiment represented in FIG. 1 comprises a housing with two housing sections 2, 3. In the lower of the two housing sections a chuck 5 is disposed on which a semiconductor substrate 7 is laid and held. The chuck 5 comprises a chuck-positioning unit 6 with which the chuck 5 can be moved in the x-direction, the y-direction, and the z-direction and can be turned about the z-axis within certain angular range. The chuck 5, including its chuck positioning unit 6, is mounted on a base plate 1 of the probe station and encased laterally by a lower housing wall 10.

Disposed lying opposite the chuck 5 and at the same time the semiconductor substrate 7 is a probe holder plate 4 which closes the lower housing wall 10 at the top and thus forms the lower housing section 2. The lower housing section 2 encases the chuck 5, the chuck-positioning unit 6, and the semiconductor substrate 7. The lower housing wall 10, the base plate 1, and the probe holder plate 4 consist of an electrically conductive material and realize, in given cases enhanced by a special structure of the chuck 5, the EMI shielding of the semiconductor substrate 7.

The upper housing section 3, whose wall also consists of electrically conductive material for EMI shielding of the components disposed therein, extends above the probe holder plate 4. Consequently, the probe holder plate 4 subdivides the housing of the probe station into a lower housing section 2 and an upper housing section 3, where both housing sections realize an EMI shielding for the environment and any other housing section. The individual parts of the housing and the probe holder plate 4 are electrically connected to one another via their surface contacts so that a closed shielding is achieved.

In the probe holder plate 4 a central opening 26 is disposed through which the probes 24, which are mounted on the probe holder plate 4 by means of probe heads 21, electrically contact the semiconductor substrate 7. The central opening 26 of the probe holder plate 4 is an opening in the shielding of the lower housing section 2 at the top as well as the upper housing section 3 at the bottom. This opening is closed almost completely by a Protec plate 12 which extends between the probe holder plate 4 and the semiconductor substrate 7 and only comprises an opening in the immediate area of the contacting of the semiconductor substrate 5 [sic] by the probe tips 25. Since the Protec plate 12 expands the shielding of both housing sections 2, 3 adjacent to one another, the Protec plate 12 also consists of an electrically conductive material and is mounted on the probe holder plate 4 by means of a spacer 14. In one development the spacers consist of electrically insulating material.

The upper housing section 3 is in turn subdivided by a monitoring area 40 into two subsections by the monitoring area 40 extending in the center and over the entire depth (as seen perpendicular to the plane of the drawing) of the upper housing section and from the upper housing wall 30 being sunken nearly up to the probe holder plate 4. The sunken monitoring area 40 is bounded in the direction towards the probe holder plate 4 by the sunken part 31 of the upper-side housing wall 30 which runs approximately parallel to and at such a distance from the probe holder plate 4 that at this distance the probes 24 can extend without contacting the probe holder plate 4 or said sunken part 31.

With the sinking of the housing wall in the monitoring area 40, monitoring in the immediate vicinity of the probe tips 25 is made possible. To the extent that, according to an additional form of embodiment, the sunken part 32 is clearly larger than the central opening 26 of the probe holder plate 4, then, with a parallel arrangement of both opposite components, with a slight distance between both, and with suitable pressure conditions in the lower housing section 2, a flow resistance can be realized which in the case of the opening of an upper housing section 3 minimizes a possible air flow from the housing opening to the semiconductor substrate 7 and thus its humidification or contamination as a consequence of the air flow.

The sunken part 31 of the upper-side housing section 30 comprises in one development a monitoring opening 41. The monitoring opening 41 extends above the area in which the probe tips 25 contact the semiconductor substrate 5 [sic] and thus above the opening of the Protec plate 12 and the central opening 26 of the probe holder plate 4. To close the upper housing section 3 in the monitoring area 40 the monitoring opening 41 is in turn closed by a cover plate 42 through which in an additional development the objective of a microscope 43 is guided. By means of the microscope 43 the production of the contact between the probe tips 25 and semiconductor substrate 5 [sic] as well as its retention during the test is monitored.

To the side, the monitoring area 40 at the two adjacent subsections of the upper housing section 3 is bounded by an additional housing wall part running obliquely to the upper-side housing wall 30, said part closing the space between the upper-side housing wall 30 and its sunken part 31 and in the following being denoted as the bevel 32. Consequently, each of the two upper housing sections 3 are formed by lateral housing walls 31 and upper-side housing walls 30 as well as by a bevel 32 and the probe holder plate 4.

Each of the upper housing sections 3 comprises a group of probe heads 21. Each probe head 21 receives a probe 24 and comprises a probe-positioning unit 22, in the present case micrometer screws, with which each probe 24 individually can be precisely positioned in the x-direction, y-direction, and z-direction. In alternative developments of the probe station other, also electrically driven, means for the positioning of the probe 24 can be disposed instead of the micrometer screws, or the probes 24 themselves are not movable so that the contacting of the semiconductor substrate 7 by the probes 24 is done by means of an infeed movement which is executed by the chuck positioning unit 6 or by a movement of the entire probe holder plate 4.

The two groups of probe heads 21 are disposed on both sides of the central opening 26 of the probe holder plate 4 and thus one in each of the above-described upper housing sections 3. Immediately next to each group of probe heads 26, and thus within each upper housing section, a signal preparation device 27 is disposed on the probe holder plate 4. While, for example, with a signal processing unit the signals picked up from the semiconductor substrate 7 can be evaluated at least in a first step, with a signal preprocessing unit different initial measurement signal processing takes place with which the measurement signal is preprocessed for transmission and additional processing, but is not changed qualitatively. Such preprocessing measures are, for example, a filtering or a preamplification. Each signal preparation device 27 is connected via a connector 29 to measurement devices disposed outside of the housing and not represented in more detail, where the housing passageway is realized by means of suitable contacts adapting the EMI shielding to the external devices. It is obvious that, alternatively, several signal preparation devices 27 can be located in the upper housing section.

An additional development of the probe station comprises a remote interface 29a for transmitting data and signals to and from an external computer. Depending on the type and extent of the testing of the semiconductor substrate 7, the configuration of the probe heads, e.g., with a probe positioning unit 22, or additional requirements on the control of the test, the contacting of the semiconductor substrate 7, a signal energization, or a signal pick-up, different processing steps of the signals and data obtained from the external computer can be carried out in a controlled manner via the remote interface.

According to an additional development it must be possible to open the individual housing sections 2, 3 separately from one another. In this case the connection and the configuration of the two upper housing sections 3 is formed so that each upper housing section 3 alone and also the entire housing section 3 located above the probe holder plate can be opened so that any group of probe heads 21 alone as well as the entire arrangement of probes is freely accessible. The opening of one of the two upper housing sections 3 is done by means of the upper-side housing wall 30, which is implemented as a pivotable flap 34 with the upper edge of one of the lateral housing walls 31 as its pivot axis. For this purpose at least one of the lateral housing walls 31 is connected to the probe holder plate 4 and fixed. In order to achieve the accessibility of the probes 24 and the probe heads 21, the bevel 33 is connected to the adjacent upper-side housing wall 30 and is thus part of the flap 34. To the extent that, according to an additional development of the housing wall, the front, i.e., facing towards the observer of FIG. 1, part of the lateral housing wall 31 is connected to the flap 34 (FIG. 2), by opening the flap 34 of one of the two upper housing sections 3 the probe heads 21 located therein and in given cases the signal preparation device 27 are freely accessible from three sides.

Figure 2:
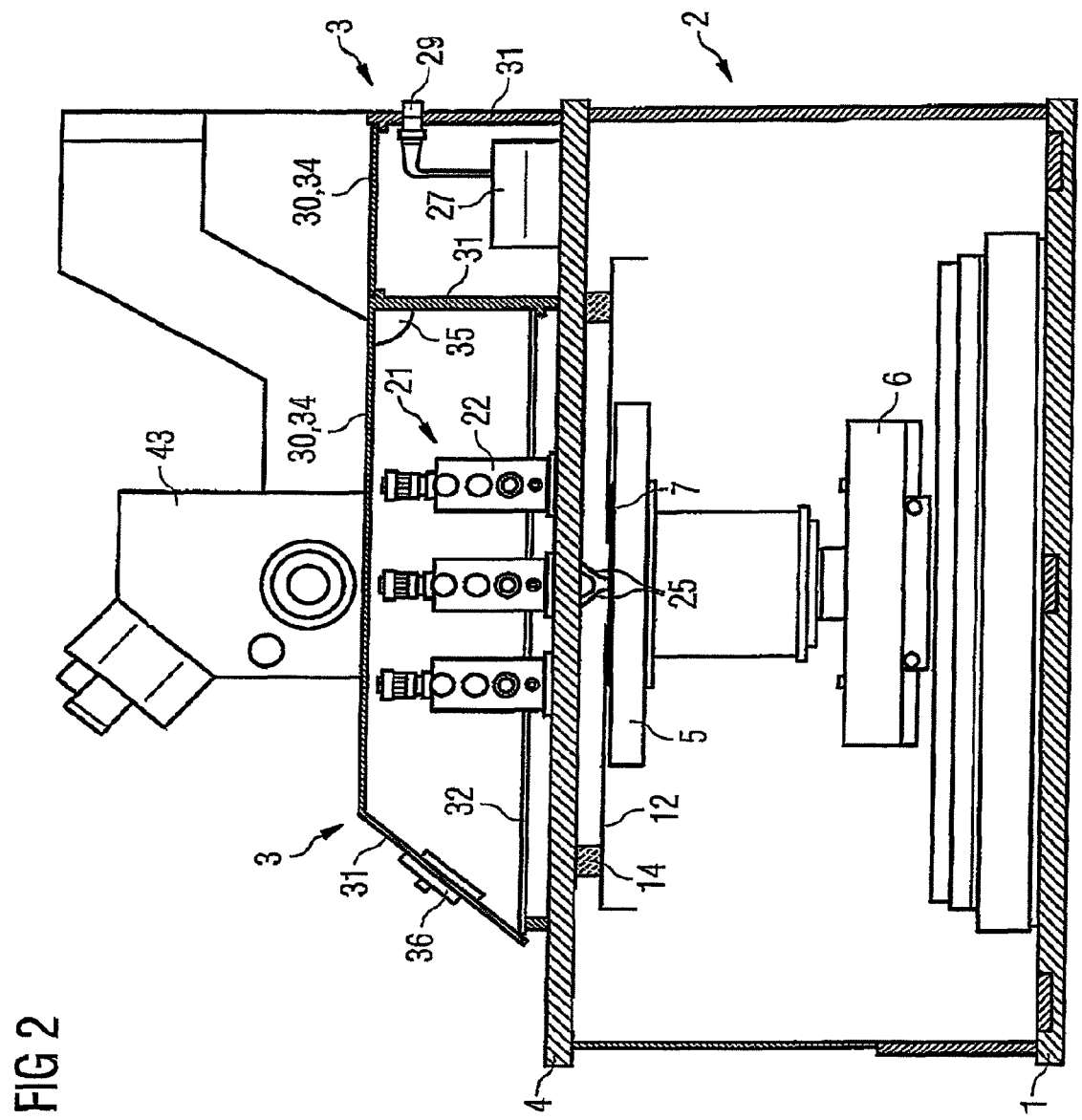
FIG. 2 shows, in a lateral sectioned representation, a probe station according to FIG. 1, said probe station being expanded on its rear side by an additional housing section.

With the two remaining fixed lateral housing walls 31, the rear one and the one turned away from the monitoring area 30, fixed components for receiving hinges 35 (FIG. 2) for pivoting the flap 34 and for receiving connectors 29 for the connection of cables are available. With this, the components within the upper housing section 3, e.g., for positioning and for changing probes 24, are freely accessible and vibration-free opening and closing of the flaps as well as different electrical connections of the components of the probe station from outside can be produced. Merely for clarity the fixed parts of the housing wall are indicated in FIG. 1 and FIG. 2 with a greater thickness and with hatching without the material and the structure of these parts having to be different from the movable parts serving for opening the housing.

Moreover, the implementation of the wall of the upper housing section 3 in the monitoring area 30 [sic] also permits the removal of the sunken part 32 of the upper-side housing wall 30, where said sunken part connects both housing sections 3, so that the entire arrangement on the probe holder plate 4 is freely accessible. The implementation of the sunken part 32 can be implemented in the form of a pivotable cover which is pivotable if the two flaps 34 connecting thereto are opened. Alternatively, it is also possible to configure the sunken part 32 [as a] detachable plate which can be removed completely if needed.

To the extent that, for monitoring, the objective of a microscope 43 is guided close to the probe tips 25, in an additional development the above-described cover plate 42, which closes the one monitoring opening 41 in the sunken part 32, can be connected to the microscope 43 so that when the microscope 43 is lifted this cover plate 42 is entrained and lifted far enough that the additional housing wall parts to be opened can be pivoted or removed.

The different components of the housing of the probe station are independently of their function always implemented and connect to the adjacent movable or fixed components so that the corresponding sections of the housing are light-proof, whereby with the described probe station such a test can also be carried out on semiconductor substrates 7 in which particular demands are made on the optical test parameters.

FIG. 2 shows a probe station whose structure is essentially comparable to that represented in FIG. 1. The implementation of the front, i.e., left in FIG. 1, part of the lateral housing wall 31 with an oblique slope, said part being connected to the flap 34, serves merely for better operation of the flap closure 36 and can, depending on the configuration of the entire housing, obviously also have a different configuration.

The upper housing sections 3 of the probe station according to FIG. 2 which are located above the probe holder plate 4 are expanded by at least one additional one which is disposed on the rear side and can accommodate additional measurement technology or components for signal preparation. Also this upper housing section 3 can be opened by a flap 34 which is formed by the upper-side housing wall 30 and a part of the lateral housing wall 31 facing away from the microscope (said housing wall not being visible in FIG. 2). The wall which encloses that expanding upper housing section can also consist of electrically conductive material in order to also include this housing section in the EMI shielding system and at the same time to realize a shielding with respect to the neighboring housing sections.

In the form of embodiment according to FIG. 2 a signal preparation device 27 is not disposed in that upper housing section 3 which comprises the probe heads 21 but rather in the expanded rear-side upper housing section. To the extent this device 27 is, for example, an impedance analyzer, the shielding of this expanded upper housing section 3 is implemented by a ferromagnetic wall of greater thickness.

In additional developments the housing of the probe station can be expanded by additional sections and subdivided into additional sections in order to adapt the housing, and thus also the EMI shielding system, to the requirements of different tests in a variable manner. Thus, the type of shielding can also be selectively adapted to the enclosed components and, for example, individual housing sections can be shielded with respect to high-frequency interference fields or with respect to low-frequency magnetic fields. In an additional development various expansions or subdivisions of the housing wall are configured so as to be detachable so that the housing can be modified in a modular manner by the user of the probe station her/himself.

Figure 3:
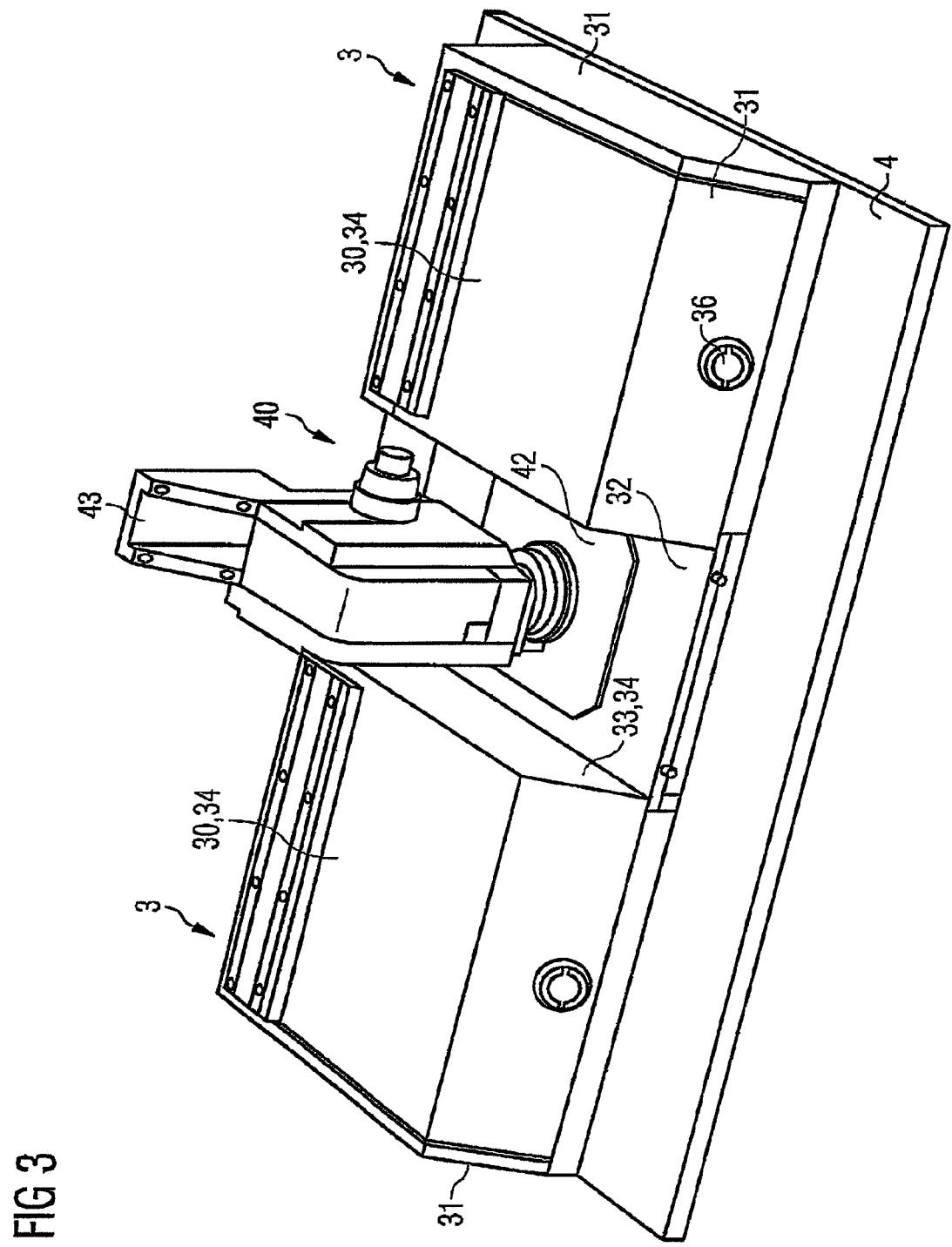
FIG. 3 shows a perspective top view of a housing section of a probe station, said housing section encasing the probes including the probe holder.

FIG. 3 shows a perspective representation of two upper housing sections 3 of a probe station which are disposed over a probe holder plate 4 with a monitoring area 40 located therebetween as described for FIG. 1. In the embodiment example represented, in the monitoring area 40 a microscope 43 is combined with a camera for photographing the contacting of the semiconductor substrate 7 by the probe tips 25.

The invention claimed is:

1. Probe station for testing semiconductor substrates comprising:
   a chuck for receiving a semiconductor substrate to be tested,
   a probe holder plate on which probes for electrical contacting of the semiconductor substrate to be tested are disposed by a probe holder, the probes and probe holder comprising a probe arrangement,
   at least one positioning system for positioning said semiconductor substrate with respect to the probes,
   a housing enclosing at least the chuck and the probe arrangement and forming an electromagnetic shielding, said housing being subdivided by the probe holder plate into at least a probe housing and an other housing section, the probe housing completely enclosing the probe arrangement,
   wherein the probe housing is adapted to be opened independently of the other housing section in such a manner that through an opening of the probe housing a part of the probe arrangement or the entire probe arrangement is optionally accessible and at least one section of a wall of the probe housing bounding the probe holder does not participate in the opening of the probe housing, and
   a device for signal preparation, said device preprocessing and/or processing a signal from the probes, and being disposed within the housing.

2. Probe station for testing semiconductor substrates according to claim 1, wherein the probe housing comprises a monitoring area with a monitoring opening for monitoring probe tips in contact with the semiconductor substrate, wherein the monitoring area comprises a section sunken from an enclosing wall of the housing in a direction of the probe tips, and at least a part of the housing wall enclosing the monitoring area forms, with the sunken section, a probe housing flap to be opened, whereby, on opening the flap, at least a part of the probe arrangement is accessible.

3. Probe station for testing semiconductor substrates according to claim 2, wherein the sunken section of the housing wall is disposed parallel to the probe holder plate and at such a minimal distance from the plate that the probes between the probe holder plate and the sunken section of the housing wall extend without contacting one of the sunken section and the plate.

4. Probe station for testing semiconductor substrates according to claim 2, wherein the monitoring area in an area of the probe tips comprises an opening which is covered by a cover plate which lies on the enclosing housing wall.

5. Probe station for testing semiconductor substrates according to claim 1, wherein at least one housing section opposite to at least one other housing section comprises the shielding and also comprises an entire housing opposite to an external environment.

6. Probe station for testing semiconductor substrates according to claim 1, wherein the device for signal preparation is disposed in a separate housing section enclosed on all sides and adapted to be opened, said separate housing section being separate from said probe housing and electromagnetically shielded with respect to the probe housing.

7. Probe station for testing semiconductor substrates according to claim 6, wherein the separate housing section comprises a shielding different from the rest of the housing.

8. Probe station for testing semiconductor substrates according to claim 6, wherein at least one housing section opposite to at least one other housing section comprises the shielding and also comprises an entire housing opposite to an external environment.

9. Probe station for testing semiconductor substrates according to claim 1, wherein the housing realizes a shielding against low-frequency magnetic fields.

10. Probe station for testing semiconductor substrates according to claim 1, wherein the housing is light-proof.

11. Probe station for testing semiconductor substrates according to claim 1, wherein the probe holder comprises a probe-positioning unit.

12. Probe station for testing semiconductor substrates according to claim 1, wherein the housing is subdivided into function sections closed with respect to one another and detachable from one another.

* * * * *